(12) United States Patent
Kim

(10) Patent No.: US 10,447,957 B2
(45) Date of Patent: *Oct. 15, 2019

(54) UNIT PIXEL AND OPERATING METHOD THEREOF AND CMOS IMAGE SENSOR USING THE SAME

(71) Applicant: SK hynix Inc., Gyeonggi-do (KR)

(72) Inventor: Tae-Gyu Kim, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 6 days.

This patent is subject to a terminal disclaimer.

(21) Appl. No.: 15/416,323

(22) Filed: Jan. 26, 2017

(65) Prior Publication Data

US 2017/0295335 A1    Oct. 12, 2017

(30) Foreign Application Priority Data

Apr. 12, 2016  (KR) .................. 10-2016-0044740

(51) Int. Cl.
| | | |
|---|---|---|
| *H04N 5/357* | (2011.01) | |
| *H04N 5/374* | (2011.01) | |
| *H04N 5/378* | (2011.01) | |
| *H01L 27/146* | (2006.01) | |

(52) U.S. Cl.
CPC ....... *H04N 5/378* (2013.01); *H01L 27/14612* (2013.01); *H04N 5/3575* (2013.01); *H04N 5/374* (2013.01)

(58) Field of Classification Search
CPC ...... H04N 5/378; H04N 5/374; H04N 5/3575; H04N 5/363; H04N 5/37457; H01L 27/14612; H01L 27/14603; H01L 27/14605; H01L 27/14614; H01L 27/14641; H01L 27/14643; H01L 27/14689; H01L 31/112
USPC ......................................... 348/308
See application file for complete search history.

(56) References Cited

U.S. PATENT DOCUMENTS

| | | | |
|---|---|---|---|
| 8,659,339 B2 | 2/2014 | Jung et al. | |
| 9,413,991 B2* | 8/2016 | Lee | H04N 5/35527 |
| 9,860,467 B2* | 1/2018 | Kim | H04N 5/3745 |
| 9,865,634 B2* | 1/2018 | Kim | H01L 27/14614 |
| 10,021,332 B2* | 7/2018 | Uemura | H04N 5/3745 |
| 2015/0288900 A1* | 10/2015 | Lee | H04N 5/35527 |
| | | | 348/222.1 |

(Continued)

FOREIGN PATENT DOCUMENTS

JP     1993-048844     2/1993

*Primary Examiner* — Pritham D Prabhakher
(74) *Attorney, Agent, or Firm* — IP & T Group LLP

(57) ABSTRACT

This technology relates a unit pixel and an operating method thereof and a CMOS image sensor using the same. The unit pixel may include a photo sensitive device; a reset transistor; a selection transistor including a gate terminal, a first terminal and a second terminal, suitable for operating in response to a selection control signal applied to the gate terminal and outputting a voltage applied to the first terminal to a first terminal of the reset transistor through the second terminal; and a drive transistor including a first terminal coupled to the second terminal of the selection transistor, a second terminal and a gate terminal, suitable for generating an electrical signal corresponding to charges accumulated in a floating diffusion node coupled to the gate terminal, and outputting the electrical signal as a pixel signal through the second terminal.

17 Claims, 4 Drawing Sheets

(56) References Cited

U.S. PATENT DOCUMENTS

| | | | |
|---|---|---|---|
| 2016/0014353 A1* | 1/2016 | Lee | H04N 5/347 |
| | | | 250/208.1 |
| 2016/0079288 A1* | 3/2016 | Choi | H01L 27/1463 |
| | | | 438/70 |
| 2016/0093654 A1* | 3/2016 | Kim | H01L 27/14614 |
| | | | 250/208.1 |
| 2016/0249002 A1* | 8/2016 | Kim | H04N 5/3745 |
| 2016/0273961 A1* | 9/2016 | Kim | G01J 1/44 |
| 2016/0277695 A1* | 9/2016 | Oguro | H04N 5/3698 |
| 2016/0300873 A1* | 10/2016 | Kim | H01L 27/14641 |
| 2017/0024868 A1* | 1/2017 | Bock | H04N 5/363 |
| 2017/0125123 A1* | 5/2017 | Eshel | G11C 27/02 |
| 2017/0127004 A1* | 5/2017 | Uemura | H04N 5/3745 |
| 2017/0195603 A1* | 7/2017 | Kawazu | H04N 5/378 |
| 2017/0289470 A1* | 10/2017 | Deng | H04N 5/357 |

* cited by examiner

UNIT PIXEL AND OPERATING METHOD THEREOF AND CMOS IMAGE SENSOR USING THE SAME

CROSS-REFERENCE TO RELATED APPLICATION

The present application claims priority of Korean Patent Application No. 10-2016-0044740, filed on Apr. 12, 2016, which is incorporated herein by reference in its entirety.

BACKGROUND

1. Field

Exemplary embodiments of the present invention relate to a complementary metal oxide semiconductor (CMOS) image sensor (CIS).

2. Description of the Related Art

Generally, in a conventional CIS to remove an offset value inherent in a pixel itself, only a pixel signal corresponding to actual incident light is measured by comparing a pixel value, before a light signal is incident with a pixel signal after the light signal is incident. Such a scheme is called correlated dual sampling (CDS).

The offset may be attributable to a difference between manufacturing processes. Typically, in a conventional CIS, the threshold voltage values are not constant due to a difference in the manufacturing process of drive transistors and thus a CDS procedure which includes two readout operations has to be performed. Accordingly, power consumption is increased, the data conversion time is reduced due to an increase of the readout time, and a noise characteristic is deteriorated, thereby making it difficult to implement a high-resolution CIS.

SUMMARY

Various embodiments are directed to the provision of a unit pixel, an operating method of the unit pixel, and a CMOS image sensor (CIS) using the same, wherein a pixel signal is accurately read out through one readout operation by compensating for a difference between the threshold voltages of drive transistors through a change in the pixel structure and the adjustment of control timing.

In an embodiment, a unit pixel, may comprise a photo sensitive device; a reset transistor; a selection transistor including a gate terminal, a first terminal and a second terminal, suitable for operating in response to a selection control signal applied to the gate terminal and outputting a voltage applied to the first terminal to a first terminal of the reset transistor through the second terminal; and a drive transistor including a first terminal coupled to the second terminal of the selection transistor a second terminal and a gate terminal, suitable for generating an electrical signal corresponding to charges accumulated in a floating diffusion node coupled to the gate terminal, and outputting the electrical signal as a pixel signal through the second terminal.

Furthermore the drive transistor may form a diode connection with respect to an output node and extracts a threshold voltage. When the selection transistor may be turned off in response to the selection control signal with a low level in a state in which the reset transistor may have been turned on in response to a reset control signal with a high level, a voltage at the gate terminal of the drive transistor converges on a value which may be higher than a voltage of an output node by a threshold voltage. The unit pixel may further comprise an additional selection transistor including a gate terminal, a first terminal and a second terminal, suitable for operating in response to the selection control signal applied to the gate terminal and outputting the electrical signal of the drive transistor applied to the first terminal as the pixel signal through the second terminal. The photo sensitive device may generate photo charges corresponding to incident light, the selection transistor may operate in response to the selection control signal applied to the gate terminal and may output a voltage applied to a drain terminal as the first terminal through a source terminal as the second terminal, the reset transistor may transfer a voltage applied from the source terminal of the selection transistor to a drain terminal of the reset transistor to the floating diffusion node coupled to a source terminal of the reset transistor in response to a reset control signal applied to a gate terminal of the reset transistor, and the drive transistor may have a drain terminal coupled to the source terminal of the selection transistor, may generate the electrical signal corresponding to the charges accumulated in the floating diffusion node coupled to the gate terminal of the drive transistor, and may output the electrical signal as the pixel signal through a source terminal of the drive transistor.

In an embodiment, an operating method of a unit pixel may comprise resetting a photo sensitive device; performing a photoelectric conversion; forming, by a drive transistor, a diode connection with respect to an output node when a floating diffusion node is reset; extracting a threshold voltage of the drive transistor; compensating the extracted threshold voltage by transferring photo charges to the floating diffusion node; and reading out a pixel signal based on the compensated threshold voltage.

The resetting of the photo sensitive device comprises resetting the photo sensitive device during a section in which a transfer control signal, a reset control signal and a selection control signal have been enabled. The forming of the diode connection comprises forming, by the drive transistor, the diode connection with respect to the output node when a reset transistor is turned on in response to a reset control signal with a high level after a first selection transistor is turned on in response to a selection control signal with a high level. The extracting of the threshold voltage of the drive transistor comprises converging a voltage at a gate terminal of the drive transistor by a threshold voltage compared to a voltage of the output node when a first selection transistor is turned off in response to a selection control signal with a low level in a state in which a reset transistor may have been turned on in response to a reset control signal with a high level. The compensating of the extracted threshold voltage comprises transferring photo charges corresponding to an image signal from the photo sensitive device to the floating diffusion node so that a voltage at a gate terminal of the drive transistor may be changed based on the extracted threshold voltage when a first selection transistor may be turned on in response to a selection control signal with a high level and a transfer transistor may be then turned on in response to a transfer control signal with a high level after a reset transistor may be turned off in response to a reset control signal with a low level.

In an embodiment, complementary metal oxide semiconductor (CMOS) image sensor, may comprise a photo sensitive device; a reset transistor; a first selection transistor including a gate terminal, a first terminal and a second terminal, suitable for operating in response to a selection control signal applied to the gate terminal and outputting a voltage applied to the first terminal to a first terminal of the reset transistor through the second terminal; a drive transistor including a first terminal coupled to the second terminal of the first selection transistor, a second terminal and a gate terminal, suitable for generating an electrical signal corresponding to charges accumulated in a floating diffusion node coupled to the gate terminal, and outputting the electrical signal as a pixel signal through the second terminal; and a readout processing unit suitable for reading out the pixel signal output by the drive transistor.

The drive transistor may form a diode connection with respect to an output node and extracts a threshold voltage. When the first selection transistor may be turned off in response to the selection control signal with a low level in a state in which the reset transistor may have been turned on in response to a reset control signal with a high level, a voltage at the gate terminal of the drive transistor converges on a value which may be higher than a voltage of an output node by a threshold voltage. The CMOS image sensor may further comprise a second selection transistor including a gate terminal, a first terminal and a second terminal, suitable for operating in response to the selection control signal applied to the gate terminal and outputting the electrical signal of the drive transistor applied to the first terminal as the pixel signal through the second terminal. The photo sensitive device may generate photo charges corresponding to incident light, the first selection transistor may operate in response to the selection control signal applied to the gate terminal and may output a voltage applied to a drain terminal as the first terminal through a source terminal as the second terminal, the reset transistor may transfer a voltage applied from the source terminal of the first selection transistor to a drain terminal of the reset transistor to the floating diffusion node coupled to a source terminal of the reset transistor in response to a reset control signal applied to a gate terminal of the reset transistor, and the drive transistor may have a drain terminal coupled to the source terminal of the first selection transistor, may generate the electrical signal corresponding to the charges accumulated in the floating diffusion node coupled to the gate terminal of the drive transistor, and may output the electrical signal as the pixel signal through a source terminal of the drive transistor.

BRIEF DESCRIPTION OF THE DRAWINGS

The above and other features and advantages of the present invention will become more apparent to those skilled in the art to which the present invention belongs by the following detailed description with reference to the attached drawings in which.

DETAILED DESCRIPTION

Figure 1A:
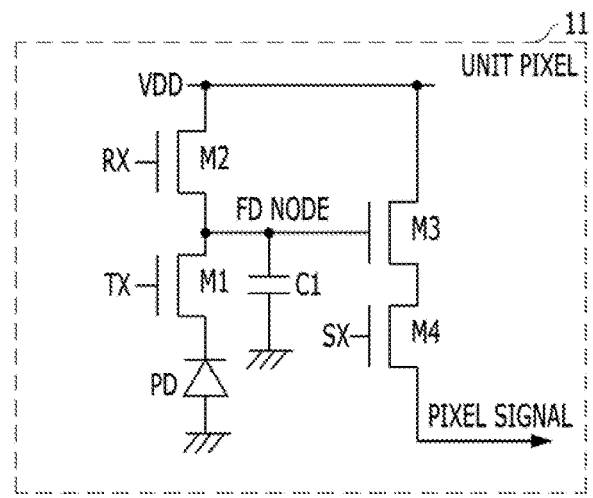
FIG. 1A is a circuit diagram of a unit pixel.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1B:
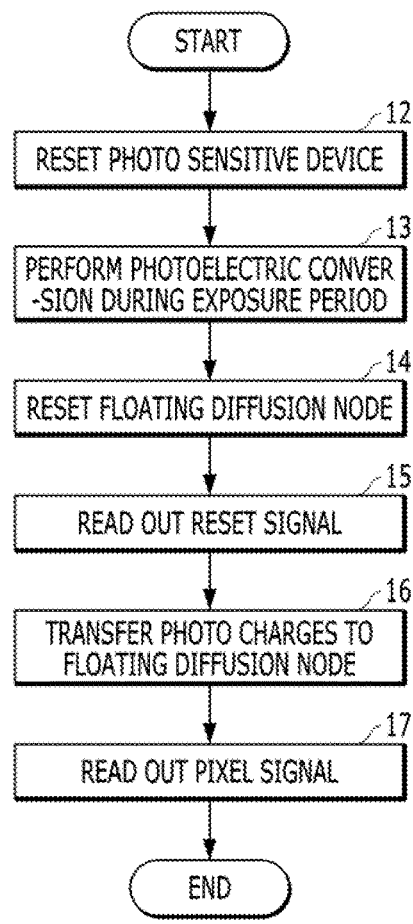
FIG. 1B is a flowchart illustrating an operating method of the unit pixel of FIG. 1A.
Figure 1C:
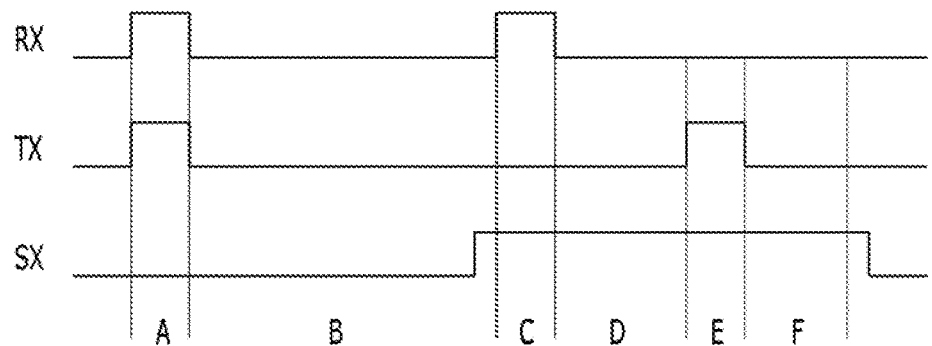
FIG. 1C is a waveform diagram illustrating signals used in the unit pixel of FIG. 1A.

FIG. 1A is a circuit diagram of a unit pixel 11, FIG. 1B is a flowchart illustrating an operating method of the unit pixel of FIG. 1, and FIG. 1C is a waveform diagram strafing signals used in the unit pixel of FIG. 1A.

Referring to FIG. 1A, the unit pixel 1 includes a photo sensitive device PD, a transfer transistor M1, a reset transistor M2, a drive transistor M3 and a selection transistor M4.

The photo sensitive device PD performs a photoelectric conversion function. That is, the photo sensitive device PD receives external light and generates photo charges based on the received light. In operation, the photo sensitive device PD may be turned on or off in response to a control signal output by a control unit (not shown). When the photo sensitive device PD is in an on state it generates photo charges by sensing incident light. In contrast, when the photo sensitive device PD is an off state, it does not sense incident light. The photo sensitive device PD may be implemented using at least one of a photo diode, a photo transistor, a photo gate, and a pinned photo diode (PPD).

The transfer transistor M1 transfers the photo charges of the photo sensitive device PD, coupled to one terminal of the transfer transistor M1, to a floating diffusion node FD NODE coupled to the other terminal of the transfer transistor M1 in response to a transfer control signal TX applied to the gate terminal of the transfer transistor M1.

The reset transistor M2 transfers a power supply voltage VDD, received through one terminal of the reset transistor M2, to the floating diffusion node FD NODE coupled to the other terminal of the reset transistor M2 in response to a reset control signal RX applied to the gate terminal of the reset transistor M2. That is, the reset transistor M2 resets photo charges stored in the floating diffusion node FD NODE in response to the reset control signal RX. In this case, the power supply voltage VDD applied to the drain terminal of the reset transistor M2 may be an initialization voltage from a point of view of the reset transistor M2.

The drive transistor M3 has one terminal coupled to the power supply voltage VDD, generates an electrical signal corresponding to charges accumulated in the floating diffusion node FD NODE coupled to the gate terminal of the drive transistor M3, and outputs the electrical signal to the other terminal of the drive transistor M3. In this case, the drive transistor M3 plays the role of a source follower buffer amplifier.

Furthermore, the selection transistor M4 operates in response to a selection control signal SX applied to the gate terminal of the selection transistor M4 and outputs the electrical signal of the drive transistor M3, applied to one terminal of the selection transistor M4, as a pixel signal through the other terminal of the selection transistor M4. In this case, the selection transistor M4 performs a switching operation and address operation for selecting the unit pixel 11 in response to the selection control signal SX.

In this case, the floating diffusion node FD NODE is a diffusion region in which the other terminals of the transfer transistor M1 and the reset transistor M2 are configured in common. The floating diffusion node FD NODE may be modeled into a capacitor C1 unique to the floating diffusion node FD NODE because charges corresponding to an image signal or charges corresponding to an initialization voltage are accumulated in the floating diffusion node FD NODE.

An operating method of the unit pixel 11 is described below with reference to FIGS. 1B and 1C.

First, during a section (or period) A in which the transfer control signal TX and the reset control signal RX are enabled, the photo sensitive device PD is reset (12). That is, when the transfer control signal TX has a high level, the transfer transistor M1 is turned on. Accordingly, photo charges remaining in the photo sensitive device PD are transferred to the floating diffusion node FD NODE. When the reset control signal RX has a high level, the reset transistor M2 is turned on. Accordingly, the photo charges transferred and stored in the floating diffusion node FD NODE are reset.

Thereafter, the photo sensitive device PD performs a photoelectric conversion function during an exposure period B (13). That is, the photo sensitive device PD receives external light and generates photo charges corresponding to the received light.

Thereafter, during a section C in which the selection control signal SX is enabled and the reset control signal RX is enabled, the floating diffusion node FD NODE is reset (14). That is, after the selection transistor M4 is turned on in response to the selection control signal SX with a high level, the reset transistor M2 is turned on in response to the reset control signal RX with a high level. Accordingly, the photo charges stored in the floating diffusion node FD NODE are reset to a constant period for a correlated dual sampling (CDS) operation.

Thereafter, during a reset signal readout section D in which the selection control signal SX is enabled a reset signal is read out (15). That is, the drive transistor M3 generates an electrical signal corresponding to the charges (i.e., charges upon reset) accumulated in the floating diffusion node FD NODE coupled to the gate terminal of the drive transistor M3 and outputs the electrical signal as the reset signal.

Thereafter, during a section E in which the selection control signal SX is enabled and the transfer control signal TX is enabled, photo charges corresponding to an image signal are transferred to the floating diffusion node FD NODE (16). That is, when the transfer control signal TX has a high level, the transfer transistor M1 is turned on. Accordingly, the photo charges generated by the photo sensitive device PD are transferred to the floating diffusion node FD NODE.

Thereafter, during a signal readout section F in which the selection control signal SX is enabled, a pixel signal including the image signal is read out (17). That is, the drive transistor M3 generates an electrical signal corresponding to the charges (i.e., charges corresponding to the image signal) corresponding to the floating diffusion node FD NODE coupled to the gate terminal of the drive transistor M3 and outputs the electrical signal as the pixel signal including the image signal.

As described above, in the unit pixel 11 the readout operation is performed twice with respect to the reset signal and the pixel signal in order to compensate for a difference (i.e., an offset) between the threshold voltage of the drive transistors attributable to a difference between manufacture processes. That is, after the floating diffusion node FD NODE is reset, an operation for reading the reset signal is performed. Thereafter, the transfer transistor M1 is turned on, photo charges are transferred to the floating diffusion node FD NODE, and the pixel signal is then read out.

As described above, in the unit pixel a different voltage value is output for each column because threshold voltage values are not constant due to a difference in the manufacture process of the drive transistors. In order to compensate for a difference between the voltage values, a readout operation is performed twice and the CDS operation must be performed. As a result, power consumption is increased, the data conversion time is reduced due to an increase of the readout time, and a noise characteristic is deteriorated, thereby making it difficult to implement a high-resolution CIS.

In an embodiment of the present invention, a pixel signal can be accurately read out through one readout operation by compensating for a difference between the threshold voltages of the drive transistors through a change in the pixel structure and the adjustment of control timing. This is described in detail with reference to FIGS. 2A to 2C and 3.

Figure 2A:
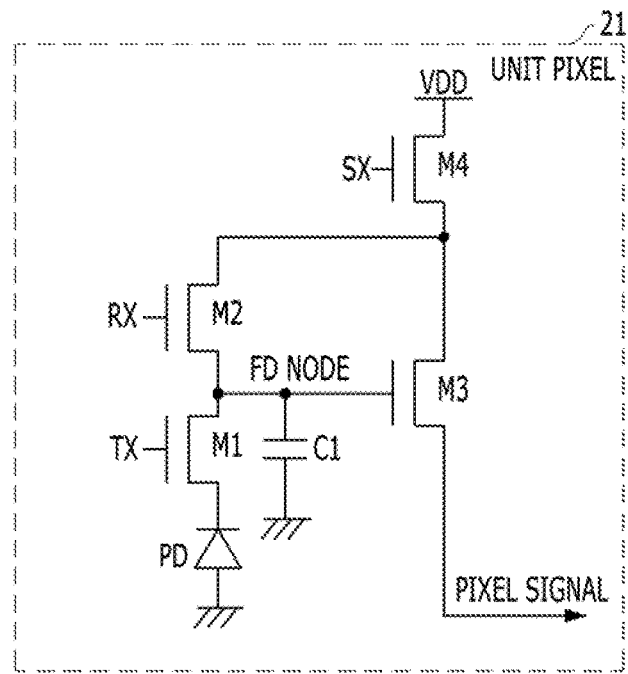
FIG. 2A is a circuit diagram of a unit pixel in accordance with an embodiment of the present invention.
Figure 2B:
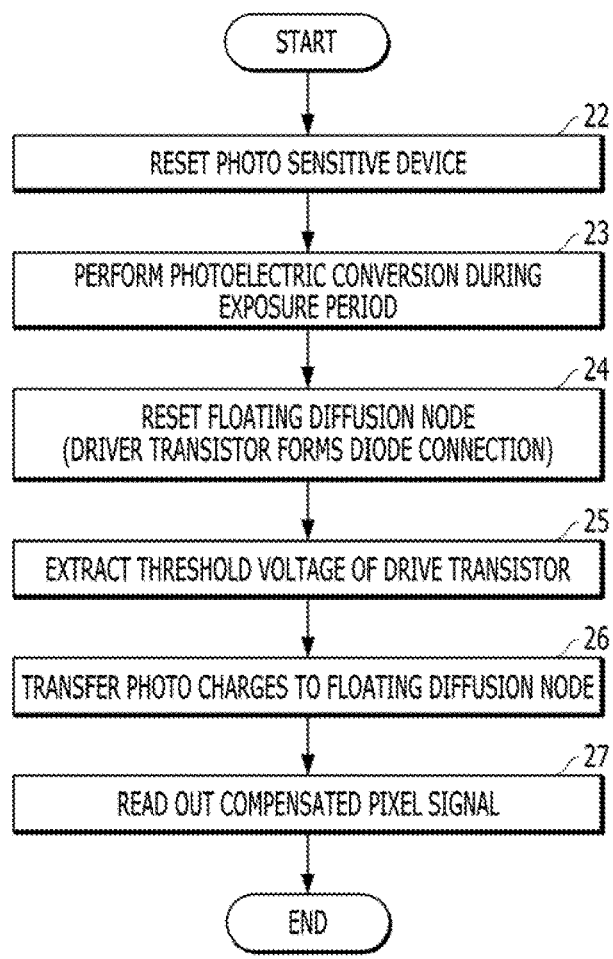
FIG. 2B is a flowchart illustrating an operating method of the unit pixel in accordance with an embodiment of the present inventions.
Figure 2C:
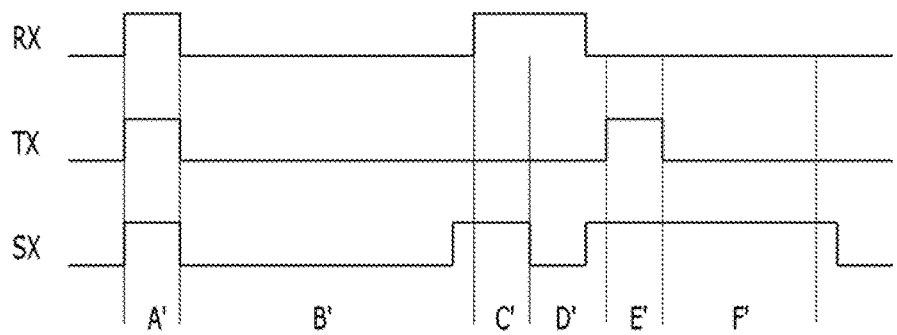
FIG. 2C is a waveform diagram illustrating signals used in the unit pixel in accordance with an embodiment of the present invention.

FIG. 2A is a circuit diagram of a unit pixel 2 in accordance with an embodiment of the present invention, FIG. 2B is a flowchart illustrating an operating method of the unit pixel in accordance with an embodiment of the present invention, and FIG. 2C is a waveform diagram illustrating signals used in the unit pixel in accordance with an embodiment of the present invention.

Referring to FIG. 2A, the unit pixel 21 includes a photo sensitive device PD, a transfer transistor M1, a reset transistor M2, a drive transistor M3 and a selection transistor M4.

In this case, the photo sensitive device PD generates photo charges corresponding to incident light. A detailed configuration and operation of the photo sensitive device PD are the same as those described with reference to FIG. 1A, and a further description of the photo sensitive device PD is omitted.

The transfer transistor M1 transfers the photo charges of the photo sensitive device PD, coupled to the source terminal of the transfer transistor M1, to a floating diffusion node FD NODE coupled to the drain terminal of the transfer transistor M1 in response to a transfer control signal TX applied to the gate terminal of the transfer transistor M1.

The reset transistor M2 transfers a power supply voltage VDD, applied from the source terminal of the first selection transistor M4 to the drain terminal of the reset transistor M2, to the floating diffusion node FD NODE coupled to the source terminal of the reset transistor M2 in response to a reset control signal RX applied to the gate terminal of the reset transistor M2. That is, the reset transistor M2 resets photo charges stored in the floating diffusion node FD NODE in response to the reset control signal RX.

The drive transistor M3 has a drain terminal coupled to the source terminal of the first selection transistor M4, generates an electrical signal corresponding to charges accumulated in the floating diffusion node FD NODE coupled to the gate terminal of the drive transistor M3, and outputs the electrical signal as a pixel signal through the source terminal of the drive transistor M3.

The drive transistor M3 forms a diode connection with respect to its output node and extracts a threshold voltage. That is, when the selection transistor M4 is turned off in response to a selection control signal SX with a low level in the state in which the reset transistor M2 has been turned on in response to the reset control signal RX with a high level, a voltage at the gate terminal of the drive transistor M3 converges on a value that is higher than the voltage of the output node by a threshold voltage.

The selection transistor M4 has a drain terminal coupled to a power supply voltage VDD. The selection transistor M4 operates in response to the selection control signal SX applied to the gate terminal of the selection transistor M4 and outputs the power supply voltage VDD, applied to the drain terminal of the selection transistor M4, to the drain terminals of the reset transistor M2 and the drive transistor M3 through the source terminal of the selection transistor M4.

The floating diffusion node FD NODE is a diffusion region in which the drain terminal of the transfer transistor M1 and the source terminal of the reset transistor M2 are configured in common. The floating diffusion node FD NODE may be modeled into a capacitor C1 unique to the floating diffusion node FD NODE because charges corresponding to an image signal or charges corresponding to an initialization voltage are accumulated in the floating diffusion node FD NODE.

An operating method of the unit pixel 21 is described below with reference to FIGS. 2B and 2C.

First, during a section A' in which the transfer control signal TX, the reset control signal RX and the selection control signal SX are enabled, the photo sensitive device PD is reset (22). That is, when the transfer control signal TX has a high level, the transfer transistor M1 is turned on. Accordingly, photo charges remaining in the photo sensitive device PD are transferred to the floating diffusion node FD NODE. When the selection control signal SX has a high level, the selection transistor M4 is turned on. Accordingly, the power supply voltage VDD is applied to the drain terminals of the reset transistor M2 and the drive transistor M3. When the reset control signal RX has a high level the reset transistor M2 is turned on. Accordingly the power supply voltage VDD is transferred to the floating diffusion node FD NODE, and thus photo charges stored in the floating diffusion node FD NODE are reset.

Thereafter, during an exposure period B', the photo sensitive device PD performs a photoelectric conversion function (23). That is, the photo sensitive device PD receives external light and generates photo charges corresponding to the received light.

Thereafter, during a section C' in which the selection control signal SX is enabled and the reset control signal RX is enabled, the floating diffusion node FD NODE is reset (24). In this case, when the reset transistor M2 is turned on in response to the reset control signal RX with a high level after the selection transistor M4 is turned on in response to the selection control signal SX with a high level, the drive transistor M3 forms a diode connection with respect to its output node.

Thereafter, during a section D' in which the reset control signal RX is enabled and the selection control signal SX is disabled, the threshold voltage of the drive transistor M3 is extracted (25). That is, when the selection transistor M4 is turned off in response to the selection control signal SX with a low level in the state in which the reset transistor M2 has been turned on in response to the reset control signal RX with a high level, a voltage at the gate terminal of the drive transistor M3 converges on a value that is higher than the voltage of the output node by a threshold voltage.

Thereafter, during a section E' in which the selection control signal SX is enabled and the transfer control signal TX is enabled, photo charges corresponding to an image signal are transferred to the floating diffusion node FD NODE, thus compensating for the extracted threshold voltage (26). That is, after the reset transistor M2 is turned off in response to the reset control signal RX with a low level, when the transfer transistor M1 is turned on in response to the transfer control signal TX with a high level after the selection transistor M4 is turned on in response to the selection control signal SX with a high level, the photo charges corresponding to the image signal are transferred from the photo sensitive device PD to the floating diffusion node FD NODE. Accordingly, a voltage at the gate terminal of the drive transistor M3 is changed based on the extracted threshold voltage.

Thereafter during an image signal readout section F' in which the selection control signal SX is enabled, a compensated pixel signal is read out (27). That is, the drive transistor M3 generates an electrical signal corresponding to the charges (i.e., the charges corresponding to the image signal) accumulated in the floating diffusion node FD NODE coupled to the gate terminal of the drive transistor M3, and outputs the electrical signal as the compensated pixel signal. The pixel signal includes the image signal.

If the pixel unit operates as described above a signal dropped by the threshold voltage of the drive transistor M3 is output. Accordingly, two readout operations performed to compensate for a difference (i.e., an offset) between the thresholds voltages of drive transistors attributable to a difference between manufacturing processes can be reduced to one readout operation.

Accordingly, power consumption can be reduced and a noise characteristic can also be improved because a data conversion speed can be reduced due to a reduction of the readout time.

FIG. 2A illustrates the unit pixel 21 including the one photo sensitive device PD and the four NMOS transistors M1 to M4, but an embodiment of the present invention is not limited thereto. For example, an embodiment of the present invention may be applied to all circuits including the photo sensitive device PD and at least three transistors including the drive transistor M3 and the first selection transistor M4. Furthermore, an embodiment of the present invention may be implemented by changing the design to employ PMOS transistors instead of NMOS transistors.

Figure 3:
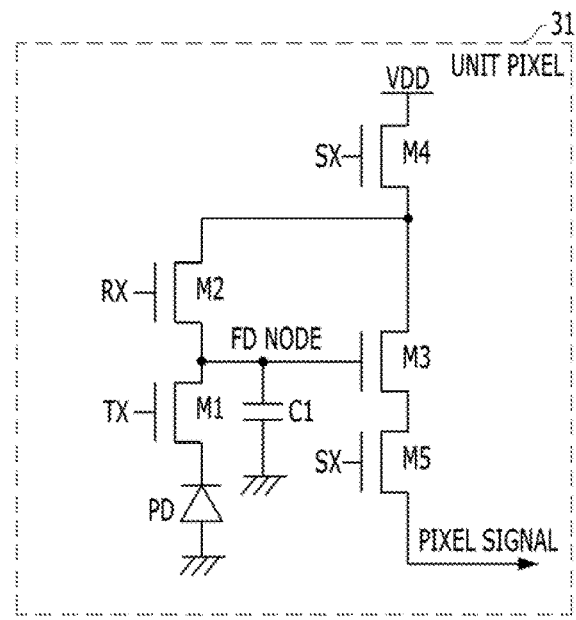
FIG. 3 is a circuit diagram of a unit pixel in accordance with another embodiment of the present invention.

FIG. 3 is a circuit diagram of a unit pixel 31 in accordance with another embodiment of the present invention. The unit pixel 31 of FIG. 3 has the same configuration and operation as that of FIGS. 2A to 2C except that it further includes a second selection transistor M5, in addition to the first selection transistor M4. Accordingly, only the second selection transistor M5 is described below.

The second selection transistor M5 operates in response to the selection control signal SX applied to the gate terminal of the second selection transistor M5, and outputs an electrical signal from the drive transistor M3 applied to the drain terminal of the second selection transistor M5 as a pixel signal through the source terminal of the second selection transistor M5, thereby being capable of separating outputs more certainly. In this case, the second selection transistor M5 may perform a switching operation and address operation for selecting the unit pixel 31 in response to the selection control signal SX.

Figure 4:
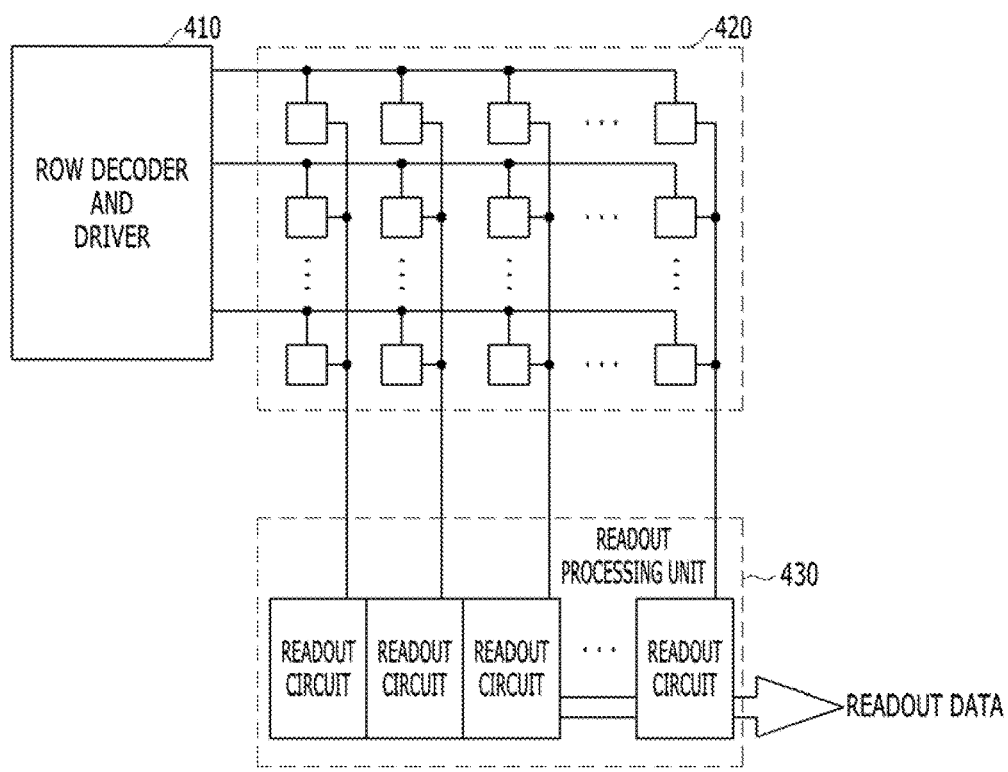
FIG. 4 is a diagram illustrating the configuration of a CMOS image sensor (CIS) to which the unit pixel is applied in accordance with an embodiment of the present invention.

FIG. 4 is a diagram illustrating the configuration of a CMOS image sensor (CIS) to which the unit pixel is applied in accordance with an embodiment of the present invention.

As shown in FIG. 4, the CIS may include a row decoder and driver 410, a pixel array 420, and a readout processing unit 430.

First, the row driver of the row decoder and driver 410 drives unit pixels that belong to the unit pixels of the pixel array 420 and that are selected by the row decoder of the row decoder and driver 410.

The pixel array 420 senses light using a photo sensitive device and generates a pixel signal (i.e., a pixel output signal) corresponding to the sensed light. In this case, a unit pixel that belongs to the unit pixels of the pixel array 420 outputs the pixel signal. The unit pixel is selected by the row decoder, and is driven by the row driver.

The readout processing unit 430 reads out the pixel signals output by the pixel array 420 and outputs them as readout data.

In accordance with an embodiment of the present invention, there is an advantage in that a pixel signal can be accurately read out through one readout operation by compensating for a difference between the threshold voltages of drive transistors through a change in the pixel structure and the adjustment of control timing.

Furthermore in accordance with an embodiment of the present invention, there are advantages in that a data conversion time can be increased, power consumption can be reduced and a noise characteristic can also be improved because the readout time is reduced by performing a single readout operation.

Accordingly, if the unit pixel and the operating method thereof in accordance with various embodiments of the present invention are used, a high-resolution CIS can be easily implemented.

It is also noted, that in some instances, as would be apparent to those skilled in the relevant art, an element (also referred to as a feature) described in connection with one embodiment may be used singly or in combination with other elements of another embodiment, unless specifically indicated otherwise.

Although various embodiments have been described for illustrative purposes, it will be apparent to those skilled in the art that various changes and modifications may be made without departing from the spirit and scope of the invention as defined in the following claims.

What is claimed is:

1. A unit pixel, comprising:
a photo sensitive device;
a reset transistor;
a selection transistor including a gate terminal, a first terminal and a second terminal, suitable for operating in response to a selection control signal applied to the gate terminal of the selection transistor and outputting a voltage applied to the first terminal of the selection transistor to a first terminal of the reset transistor through the second terminal of the selection transistor; and
a drive transistor including a first terminal coupled to the second terminal of the selection transistor, a second terminal and a gate terminal, suitable for generating an electrical signal corresponding to charges accumulated in a floating diffusion node coupled to the gate terminal of the drive transistor, and outputting the electrical signal as a pixel signal through the second terminal of the drive transistor.

2. The unit pixel of claim 1, wherein the drive transistor forms a diode connection with respect to an output node and extracts a threshold voltage.

3. The unit pixel of claim 1, wherein when the selection transistor is turned off in response to the selection control signal with a low level in a state in which the reset transistor has been turned on in response to a reset control signal with a high level, a voltage at the gate terminal of the drive transistor converges on a value which is higher than a voltage of an output node by a threshold voltage.

4. The unit pixel of claim 1, further comprising:
an additional selection transistor including a gate terminal, a first terminal and a second terminal, suitable for operating in response to the selection control signal applied to the gate terminal of the additional selection transistor and outputting the electrical signal of the drive transistor applied to the first terminal of the additional selection transistor as the pixel signal through the second terminal of the additional selection transistor.

5. The unit pixel of claim 1, wherein:
the photo sensitive device generates photo charges corresponding to incident light,
the selection transistor operates in response to the selection control signal applied to the gate terminal of the selection transistor and outputs a voltage applied to a drain terminal as the first terminal of the selection transistor through a source terminal as the second terminal of the selection transistor,
the reset transistor transfers a voltage applied from the source terminal of the selection transistor to a drain terminal as the first terminal of the reset transistor to the floating diffusion node coupled to a source terminal of the reset transistor in response to a reset control signal applied to a gate terminal of the reset transistor, and
the drive transistor has a drain terminal coupled to the source terminal of the selection transistor, generates the electrical signal corresponding to the charges accumulated in the floating diffusion node coupled to the gate terminal of the drive transistor, and outputs the electrical signal as the pixel signal through a source terminal of the drive transistor.

6. The unit pixel of claim 1, wherein the first terminal of the selection transistor is coupled to a power supply voltage and the second terminal of the selection transistor is coupled to the first terminal of the reset transistor and the first terminal of the drive transistor.

7. An operating method of a unit pixel, comprising:
resetting a photo sensitive device;
performing a photoelectric conversion;
forming, by a drive transistor, a diode connection with respect to an output node when a floating diffusion node is reset;
extracting a threshold voltage of the drive transistor;
compensating the extracted threshold voltage by transferring photo charges to the floating diffusion node; and
reading out a pixel signal based on the compensated threshold voltage.

8. The operating method of claim 7, wherein the resetting of the photo sensitive device comprises resetting the photo sensitive device during a section in which a transfer control signal, a reset control signal and a selection control signal have been enabled.

9. The operating method of claim 7, wherein the forming of the diode connection comprises forming, by the drive transistor, the diode connection with respect to the output node when a reset transistor is turned on in response to a reset control signal with a high level after a first selection transistor is turned on in response to a selection control signal with a high level.

10. The operating method of claim 7, wherein the extracting of the threshold voltage of the drive transistor comprises converging a voltage at a gate terminal of the drive transistor by a threshold voltage compared to a voltage of the output node when a first selection transistor is turned off in response to a selection control signal with a low level in a state in which a reset transistor has been turned on in response to a reset control signal with a high level.

11. The operating method of claim 7, wherein the compensating of the extracted threshold voltage comprises transferring photo charges corresponding to an image signal from the photo sensitive device to the floating diffusion node so that a voltage at a gate terminal of the drive transistor is changed based on the extracted threshold voltage when a first selection transistor is turned on in response to a selection control signal with a high level and a transfer transistor is then turned on in response to a transfer control signal with a high level after a reset transistor is turned off in response to a reset control signal with a low level.

12. A complementary metal oxide semiconductor (CMOS) image sensor, comprising:
 a photo sensitive device;
 a reset transistor;
 a first selection transistor including a gate terminal, a first terminal and a second terminal, suitable for operating in response to a selection control signal applied to the gate terminal of the first selection transistor and outputting a voltage applied to the first terminal of the first selection transistor to a first terminal of the reset transistor through the second terminal of the first selection transistor;
 a drive transistor including a first terminal coupled to the second terminal of the first selection transistor, a second terminal and a gate terminal, suitable for generating an electrical signal corresponding to charges accumulated in a floating diffusion node coupled to the gate terminal of the drive transistor, and outputting the electrical signal as a pixel signal through the second terminal of the drive transistor; and
 a readout processing unit suitable for reading out the pixel signal output by the drive transistor.

13. The CMOS image sensor of claim 12, wherein the drive transistor forms a diode connection with respect to an output node and extracts a threshold voltage.

14. The CMOS image sensor of claim 12, wherein when the first selection transistor is turned off in response to the selection control signal with a low level in a state in which the reset transistor has been turned on in response to a reset control signal with a high level, a voltage at the gate terminal of the drive transistor converges on a value which is higher than a voltage of an output node by a threshold voltage.

15. The CMOS image sensor of claim 12, further comprising:
 a second selection transistor including a gate terminal, a first terminal and a second terminal, suitable for operating in response to the selection control signal applied to the gate terminal of the second selection transistor and outputting the electrical signal of the drive transistor applied to the first terminal of the second selection transistor as the pixel signal through the second terminal of the second selection transistor.

16. The CMOS image sensor of claim 12, wherein:
 the photo sensitive device generates photo charges corresponding to incident light,
 the first selection transistor operates in response to the selection control signal applied to the gate terminal of the first selection transistor and outputs a voltage applied to a drain terminal as the first terminal of the first selection transistor through a source terminal as the second terminal of the first selection transistor,
 the reset transistor transfers a voltage applied from the source terminal of the first selection transistor to a drain terminal as the first terminal of the reset transistor to the floating diffusion node coupled to a source terminal of the reset transistor in response to a reset control signal applied to a gate terminal of the reset transistor, and
 the drive transistor has a drain terminal coupled to the source terminal of the first selection transistor, generates the electrical signal corresponding to the charges accumulated in the floating diffusion node coupled to the gate terminal of the drive transistor, and outputs the electrical signal as the pixel signal through a source terminal of the drive transistor.

17. The CMOS image sensor of claim 12, wherein the first terminal of the first selection transistor is coupled to a power supply voltage and the second terminal of the first selection transistor is coupled to the first terminal of the reset transistor and the first terminal of the drive transistor.

* * * * *